United States Patent [19]

Ley

[11] 4,066,952
[45] Jan. 3, 1978

[54] PHASE MEASURING APPARATUS

[75] Inventor: Anthony John Ley, New Canaan, Conn.

[73] Assignee: The Solartron Electronic Group Ltd., Hampshire, England

[21] Appl. No.: 703,733

[22] Filed: July 9, 1976

[30] Foreign Application Priority Data

July 12, 1975 United Kingdom ............... 29386/75

[51] Int. Cl.$^2$ ............................................. G01R 25/00
[52] U.S. Cl. .............................. 324/83 D; 307/221 D;
324/83 R
[58] Field of Search ................ 324/83 D, 83 R, 78 D,
324/77 H; 307/221 D; 235/193, 194; 328/160,
167; 357/24

[56] References Cited
U.S. PATENT DOCUMENTS

| 3,936,740 | 2/1976 | Hogg | 307/221 D |
| 3,987,293 | 10/1976 | Crooke | 307/221 D |

Primary Examiner—M. Tokar

Attorney, Agent, or Firm—William R. Sherman; Kevin McMahon; Martin M. Novack

[57] ABSTRACT

Apparatus for measuring the phase difference between two electrical signals Asin $(wt+\theta)$, Bsin $(wt+\phi)$, given a reference signal Vsin wt generated by the apparatus, comprises a phase lock loop for generating a clock frequency $f = 360F$ where F is the frequency of the reference signal. This clock frequency $f$ is then used to tune a 360 stage CCD transversal filter which is used to filter successively the two first-mentioned signals, whose phase difference is then measured by a zero intercept system. The clock frequency $f$ is used to give phase difference in degrees.

The phase lock loop comprises a 90-stage CCD to which the reference signal is applied. The output of the CCD is applied to one input of a phase sensitive detector whose other input is connected to receive the reference signal, and the control signal produced by the phase sensitive detector controls a voltage controlled oscillator whose output is applied to the clock input of the CCD.

18 Claims, 1 Drawing Figure

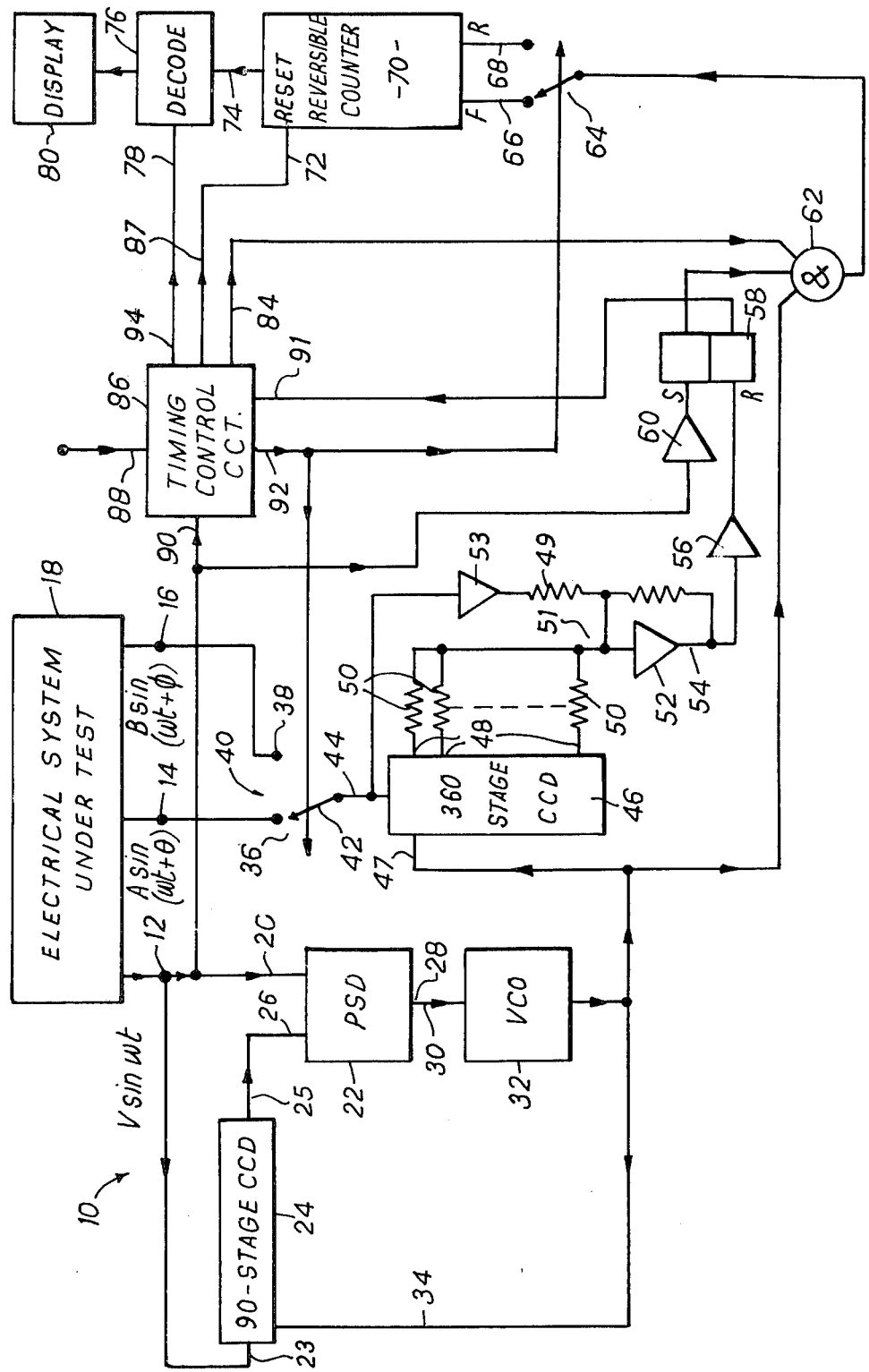

PHASE MEASURING APPARATUS

This invention relates to apparatus for measuring the phase difference between two electrical signals, and to a circuit, suitable for use in such apparatus, for generating a first output signal in predetermined phase relationship, e.g. in quadrature, with an input signal of variable frequency and a second output signal whose frequency is a multiple of the frequency of the input signal.

In the frequency response analysis of electrical systems, such as complex electrical networks and servo systems, a commonly encountered problem is that, given a reference signal V sin $wt$, it is desired to measure the phase difference either between the reference signal and a further signal A(sin $wt + \theta$) derived from a point in the electrical system being analysed, or between two further signals A sin ($wt + \theta$) and B sin ($wt + \phi$) derived from two different points in the electrical system being analysed. The reference signal is normally relatively clean, i.e. relatively uncontaminated by harmonics and random noise, and may for example be constituted by a test signal applied to the electrical system or by the cleanest signal available in the electrical system. The further signal (or each further signal), on the other hand, frequently has added components at harmonic frequencies and is often contaminated by random noise.

One known type of apparatus for measuring the phase difference between two electrical signals operates on the "zero intercept" principle, according to which the time difference between the respective zero crossings of the two signals is measured and compared with the period of the signals to determine the phase difference. However, this known type of apparatus is subject to serious errors when one or both of the signals is significantly contaminated by noise, since it becomes very difficult to determine the zero crossings of the signals accurately and repeatably. Additionally, the accuracy of this known type of apparatus is adversely affected by the presence of harmonics, particularly odd harmonics, in the two signals. To overcome these noise- and harmonic-induced errors, it has been proposed to employ narrow band analogue filters to filter the two signals, but such filters are expensive, require careful matching, and cover only a narrow frequency range; e.g. around commonly met frequencies such as 400 Hz and 2.4kHz. As a result of these difficulties, this known type of apparatus has not become widely accepted.

It is therefore an object of the present invention in one of its aspects to provide apparatus for measuring the phase difference between two electrical signals, in which apparatus the above mentioned difficulties are substantially alleviated.

According to said one aspect of the present invention, apparatus for measuring the phase difference between two electrical signals, one of which is a reference signal and the other of which may be contaminated by random noise and/or harmonics, comprises:

circuit means responsive to the reference signal to generate clock pulses whose frequency is a multiple of the frequency of the reference signal;

a transversal filter for receiving and filtering the other signal, the filter comprising an N-stage charge-coupled device for receiving and sampling the other signal and summing means connected to receive and sum respective weighted signals each derived from a respective stage of the charge-coupled device, the charge-coupled device being connected to be clocked at a frequency $Nf$, where $f$ is the frequency of the other signal, by the clock pulses or by pulses derived therefrom, and the weights of said weighted signals being selected in accordance with a predetermined function such that the transversal filter substantially reduces at least the harmonics in said other signal;

means responsive to the reference signal for generating a first timing signal at a predetermined point in each cycle thereof;

means responsive to the filtered signal from the transversal filter to produce a second timing signal at a point in each cycle thereof corresponding to said predetermined point; and counter means arranged to count the clock pulses between at least one of the first timing signals and the immediately succeeding second timing signal, whereby the count in counter means is representative of the phase difference between the reference signal and the other signal.

The weights of the weighted signals are preferably selected in accordance with the function sin $x$. Thus the summing means may be connected to receive and sum the respective signals at the outputs of all the stages of the charge-coupled device weighted in accordance with the function (1-sin $x$) and the signal at the input of the first stage of the charge-coupled device with the weight $-1$, this last weight being produced for example by an inverting amplifier.

The circuit means may comprise a variable frequency oscillator arranged to produce said clock pulses, a frequency divider connected to receive and frequency divide the clock pulses, and a phase sensitive detector having a first input for receiving the reference signal and a second input connected to receive the frequency-divided clock pulses, the phase sensitive detector being arranged to produce control signal whose magnitude is dependent on the amount by which the phase difference between the reference signal and the frequency-divided clock pulses differs from a predetermined value, and the control signal being applied to the variable frequency oscillator so as to reduce said amount.

Alternatively and preferably, the circuit means comprises a variable frequency oscillator arranged to produce said clock pulses, an M-stage charge-coupled device for receiving and sampling the reference signal and connected to be clocked by the clock pulses, whereby to produce at its output a phase-shifted version of the reference signal, and a phase-sensitive detector having a first input for receiving the reference signal and a second input connected to receive said phase-shifted version of the reference signal, the phase sensitive detector being arranged to produce a control signal dependent on the amount by which the phase shift between the respective signals at is inputs differs from a predetermined value, and the control signal being applied to the variable frequency oscillator so as to reduce said amount. In this case, the predetermined value of the phase shift is conveniently 90°; further, M is advantageously equal to 90, whereby the frequency of said clock pulses is 360 times the frequency of the reference signal, i.e. there is one clock pulse per degree in each cycle of the reference signal.

The predetermined point in each cycle of the reference signal may conveniently be the zero-crossing point, in which case the means responsive to the reference signal and the means responsive to the filtered signal may each comprise a respective squaring amplifier.

When it is desired to measure the phase difference between said other signal and a third signal which may also be contaminated by random noise and/or harmonics, the apparatus may include switching means for sequentially applying said other signal and the third signal to the transversal filter, the counter means being arranged to count in one direction between the timing signals generated during the application of said other signal to the filter and in the other direction between the timing signals generated during the application of the third signal to the filter. Alternatively, the apparatus may include a second transversal filter, identical to the first-mentioned transversal filter, for receiving and filtering the third signal, and the responsive means for producing the first and second timing signals may be respectively connected to receive the respective filtered versions of said other signal and the third signal instead of the reference signal and the filtered version of said other signal.

According to another aspect of the present invention, there is provided a circuit for generating an output signal in predetermined phase relationship with an input signal of variable frequency, the circuit comprising a variable frequency oscillator arranged to produce clock pulses, an M-stage charge-coupled device for receiving and sampling the input signal and connected to be clocked by the clock pulses, whereby to produce at its output a phase-shifted version of the input signal, and a phase-sensitive detector having a first input for receiving the input signal and a second input connected to receive said phase-shifted version of the input signal, the phase sensitive detector being arranged to produce a control signal dependent on the amount by which the phase shift between the respective signals at its inputs differs from a predetermined value, and the control signal being applied to the variable frequency oscillator so as to reduce said amount.

Conveniently, the predetermined value of the phase shift is 90°. Further, M is advantageously equal to 90, whereby the frequency of the clock pulses is maintained equal to 360 times the frequency of the input signal. Additionally, the output of the M-stage charge-coupled device can be connected to the input of a P-stage charge-coupled device, which is also connected to be clocked by the clock signal: thus if for example P is equal to 270 and each stage of each charge coupled device has a respective accessible output, then 360 phase-shifted versions of the input signal, each phase shifted 1° with respect to the preceding one, are generated.

The invention will now be described, by way of non-limitative example only, with reference to the accompanying drawing, which is a block circuit diagram of apparatus according to the present invention for measuring the phase difference between two electrical signals, the apparatus including a circuit, also in accordance with the present invention, for generating an output signal in predetermined phase relationship with an input signal of variable frequency.

The apparatus shown in the drawing is indicated generally at 10, and has three inputs 12, 14, 16 which are respectively connected to receive a reference signal V sin $wt$ and two further signals A sin $(wt+\Theta)$ and B sin $(wt+\phi)$, all derived from an electrical system 18 whose frequency response is to be analysed. The reference signal is relatively clean, i.e. relatively uncontaminated by random noise and harmonics, and may for example be a test signal applied to the system 18 for frequency response analysis purposes or the cleanest signal available in the system 18. The two further signals, on the other hand, are both likely to be contaminated by random noise and harmonics, and the object of the apparatus 10 is to measure the phase difference $\theta$-$\phi$ between them.

The reference signal at the input 12 is applied internally of the apparatus 10 to one input 20 of a multiplying phase sensitive detector 22 and, via a 90 stage charge-coupled device 24 having a signal input 23 and an output 25, to the other input 26 of the phase sensitive detector 22. The phase sensitive detector 22 produces at its output 28 a control signal whose D.C. level is dependent upon the amount by which the phase difference between the respective signals at its inputs 20, 26 differs from 90°, and this control signal is applied to the control input 30 of a voltage controlled oscillator 32. The centre operating frequency of the oscillator 32 is initially set approximately equal to 360 times the expected or nominal frequency of the reference signal, and the clock pulses produced thereby are applied to the clock input 34 of the charge-coupled device 24.

The charge-coupled device 24 continuously samples the reference signal applied to its signal input 23 at the frequency of the clock pulses, and the analogue samples of the reference signal thus produced are shifted from each stage to the next therein by successive ones of the clock pulses. At the output 25 of the charge-coupled device 24, the samples are reformed into a continuous analogue output signal by a smoothing amplifier (not shown) forming part of the device 24, this output signal being delayed or phase shifted with respect to the reference signal by about 90° by virtue of the initial setting of the centre operating frequency of the oscillator 32. The phase sensitive detector 22 then examines the phase difference between the respective signals at its inputs 20, 26, and the resulting control signal produced thereby adjusts the frequency of the oscillator 32 until this phase difference is 90°. At this point, the frequency of the clock pulses produced by the oscillator is phase locked at exactly 360 times the frequency of the reference signal, i.e. there is one clock pulse per degree in each cycle of the reference signal.

The two further signals at the inputs 14, 16 are applied to respective fixed contacts 36, 38 of a changeover switch 40, which has a wiper 42 movable between the contacts 36, 38. The wiper 42 of the switch 40 is connected to the input 44 of a 360-stage charge-coupled device 46, arranged to operate as a transversal filter. To this end, the charge-coupled device 46 has a clock input 47 connected to receive the clock pulses produced by oscillator 32, and each stage of the device 46 has a respective output 48 connected via a respective resistor 50 formed integrally with the device to the input 51 of an inverting summing amplifier 52 also formed integrally with the device 46 (i.e. the device 46, the resistors 50 and the summing amplifier 52 are implemented as a single integrated circuit). The resistors 50 are weighted, from the input to the output of the device 46, in accordance with the function (1-sin $x$). The input 44 of the device 46 is connected via a unity-gain inverting amplifier 53 and a resistor 49, also both implemented integrally with the device 46, to the input 51 of the summing amplifier 52, the weight of the resistor 49 being chosen such that the overall impulse response of the transversal filter constituted by the device 46 and its associated components is given by - [(1-sin $x$) −1] = sin $x$. The summing amplifier 52 therefore produces at its output 54 a filtered version of whichever of the signals A sin ($wt + \theta$) or B sin ($wt + \theta$) is applied to the input 44 of the charge-coupled device 46, which filtered version has practically all of the harmonics, and a substantial amount of the random noise, of the original signal applied to the input 44 removed.

The filtered signal produced at the output 54 of the summing amplifier 52 is applied to a squaring or limiting amplifier 56 which produces a square wave output signal of which the rising and falling edges coincide with the zero-crossing points of the filtered signal. The square wave output signal from the amplifier 56 is applied to the reset input of a bistable circuit 58, which responds only to the rising edges of the square wave signal. The reference signal at the input 12 is applied to a squaring or limiting amplifier 60 identical to the amplifier 56, and the resulting square wave output signal produced by the amplifier 60 is applied to the set input of the bistable circuit 58, which again responds only to the rising edges of the square wave. The bistable circuit 58 therefore produces at its set output a logic level 1 signal between each positive-going zero crossing of the reference signal and the immediately succeeding positive-going zero crossing of the filtered signal from the amplifier 52.

This logic level 1 signal is applied to, and enables, one input of a three input AND gate 62, which has a second input connected to receive the pulses produced by the oscillator 32. The output of the AND gate 62 is connectable via a two position changeover switch 64 either to the forward count input 66 or the reverse count input 68 of a three-decade BCD reversible counter 70, which has a reset input 72 and a count output 74. The count output 74 of the counter 70 is connected, via a decoder 76 having a control input 78, to a display unit 80.

The third input of the AND gate 62 is connected to a control output 84 of a timing control circuit 86, which has another control output 87 connected to the reset input 72 of the counter 70. The timing control circuit also has a control input 88 connected to receive a start signal, a control input 90 connected to receive the reference signal from the input 12, a control input 91 connected to the reset output of the bistable circuit 58, a control output 92 which controls the wiper 42 of the switch 40 and the position of the switch 64, and a control output 94 connected to the control input 78 of the decoder 76.

Upon receipt of a suitable start signal at its input 88, which start signal may be manually or automatically generated, the timing control circuit 86 sets each of the switches 40, 64 to the position illustrated in the drawing. The signal A sin ($wt + \theta$) is thus applied to the transversal filter containing the charge-coupled device 46. The timing control circuit 86 then counts the number of cycles of the reference signal at its input 90, and after several cycles, enough to allow sufficient time for loading of the charge-coupled device 46 and stabilisation (or phase locking) of the phase locked loop including the phase sensitive detector 22, the oscillator 32 and the charge-coupled device 24, produces at its outputs 84, 87 respective control signals which respectively enable the AND gate 62 and reset the count of the counter 70 to zero.

The AND gate 62 is opened by the bistable circuit 58 in response to the next succeeding positive-going zero crossing of the reference signal V sin $wt$, thus permitting the clock pulses generated by the oscillator 32 to enter and be forwardly counted in the counter 70. The immediately succeeding positive-going zero crossing of the filtered version of the signal A sin ($wt + \theta$) closes the AND gate 62 by way of the bistable circuit 58, at which point the count accumulated in the counter 70 is representative of the phase difference $\theta$, in degrees, between the signal A sin ($wt + \theta$) and the reference signal: this count will lie between 0 and 360.

As the AND gate 62 closes, a reset signal is applied to the control input 91 of the timing control circuit 86 from the reset output of the bistable circuit 58. In response to this reset signal, the circuit 86 disables the third input of the AND gate 62, and sets the switches 40, 64 to their other (or non-illustrated) positions, thus applying the signal B sin ($wt + \theta$) to the transversal filter containing the charge-coupled device 46. After again counting several cycles of the reference signal for the reasons outlined above, the timing control circuit 86 re-enables the AND gate 62, and the hereinbefore described sequence of events which follows the opening of the AND gate is repeated in relation to the signal B sin ($wt + \phi$). However, this time the counter 70 counts in the reverse direction, reducing the already accumulated count therein by an amount equal to the phase difference $\phi$, in degrees, between the reference signal and the signal B sin ($wt + \phi$). The final count in the counter 70 is thus representative of the phase difference ($\theta$-$\phi$). It will be appreciated that this final count will lie between +360 and −360.

As the AND gate 62 closes for the second time, a second reset signal is applied to the control input 91 of the timing control circuit 86 from the reset output of the bistable circuit 58. In response to this second reset signal, the circuit 86 produces a control signal at its output 94, which control signal causes the decoder 76 to read out the final count from the counter 70. The decoder 76 then decodes the final count into conventional form, i.e. into an angle lying between +180° and −180°, and applies the decoded count to the display unit 80 for display.

Many modifications can be made to the described embodiment of the invention. For example, the charge-coupled device 24 can be omitted; in this case, the output of the oscillator 32 is connected to the input 26 of the phase sensitive detector 22 via a divide-by-360 frequency divider circuit. Also, the charge-coupled device 46 can have fewer than 360 stages, for example 90, in which case the clock pulses from the oscillator 32 are applied to the clock input of the charge-coupled device 46 via a divide-by-4 frequency divider circuit. Moreover, two transversal filters, each identical to that based on the charge-coupled device 46, can be provided, one for each of the signals A sin ($wt + \theta$) and B sin ($wt + \phi$). In this case, the squaring amplifiers 56, 60 are connected to receive the respective filtered signals, and the counter 70 measures ($\theta$-$\phi$) in one operation and so need not be reversible.

Finally, the weighted output signals of the charge-coupled device 46 can be derived internally of the device 46 by appropriately selecting the respective areas of the electrodes which tap off the respective output signals from each stage, instead of by using the weighted resistors 50: the weighting function, for the respective areas, is still preferably (1-sin $x$).

What is claimed is:

1. Apparatus for measuring the phase difference between two electrical signals having the same frequency f, one of which is a reference signal and the other of which may be contaminated by harmonics, comprising:

circuit means responsive to the reference signal for generating clock pulses at a frequency which is a predetermined multiple of the frequency f of the reference signal;

a transversal filter for receiving and filtering the other signal to produce a filtered output signal, the filter comprising an N-stage charge-coupled device for receiving and sampling the other signal in combination with summing means arranged to generate the filtered output signal by receiving and summing respective weighted signals each derived from a respective stage of the charge-coupled device, the charge-coupled device being clocked in dependence upon the clock pulses at a rate equal to N times f and the weights of said weighted signals being selected in accordance with a predetermined function such that the transversal filter substantially reduces the harmonics in said other signal;

means responsive to the reference signal for generating a first timing signal at a predetermined point in each cycle thereof;

means responsive to said output signal of the transversal filter to produce a second timing signal at a point in each cycle thereof corresponding to said predetermined point; and means for determining the number of clock pulses between said first and second timing signals, said number being representative of the phase difference between the reference signal and the other signal.

2. Apparatus as claimed in claim 1, wherein the weights of the weighted signals are selected in accordance with the function sin $x$.

3. Apparatus as claimed in claim 2, wherein the summing means is connected to receive the sum of the respective signals at the outputs of all the stages of the charge-coupled device weighted in accordance with the function (1-sin $x$) and the signal at the input of the first stage of the charge-coupled device with the weight $-1$.

4. Apparatus as claimed in claim 3, comprising an inverting amplifier for effecting the weighting of the signal at the input of the first stage of the charge-coupled device.

5. Apparatus as claimed in claim 1, wherein the circuit means comprises a variable frequency oscillator arranged to produce said clock pulses, a frequency divider connected to receive and frequency divide the clock pulses, and a phase sensitive detector having a first input for receiving the reference signal and a second input connected to receive the frequency-divided clock pulses, the phase sensitive detector being arranged to produce a control signal whose magnitude is dependent on the amount by which the phase difference between the reference signal and the frequency-divided clock pulses differs from a predetermined value, and the control signal being applied to the variable frequency oscillator so as to reduce said amount.

6. Apparatus as claimed in claim 1, wherein the circuit means comprises a variable frequency oscillator arranged to produce said clock pulses, an M-stage charge-coupled device for receiving and sampling the reference signal and connected to be clocked by the clock pulses, whereby to produce at its output a phase-shifted version of the reference signal, and a phase-sensitive detector having a first input for receiving the reference signal and a second input connected to receive said phase-shifted version of the reference signal, the phase sensitive detector being arranged to produce a control signal dependent on the amount by which the phase shift between the respective signals at its inputs differs from a predetermined value, and the control signal being applied to the variable frequency oscillator so as to reduce said amount.

7. Apparatus as claimed in claim 6, wherein the predetermined value of the phase shift is 90°.

8. Apparatus as claimed in claim 7, wherein M is equal to 90, whereby the frequency of said clock pulses is 360 times the frequency of the reference signal and there is one clock pulse per degree in each cycle of the reference signal.

9. Apparatus as claimed in claim 1, wherein the predetermined point in each cycle of the reference signal is the zero-crossing point.

10. Apparatus as claimed in claim 9, wherein the means responsive to the reference signal and the means responsive to the filtered signal each comprise a respective squaring amplifier.

11. Apparatus as claimed in claim 1, for use when it is desired to measure the phase difference between said other signal and a third signal which may also be contaminated by harmonics, the apparatus further including switching means for sequentially applying said other signal and the third signal to the transversal filter, the number-determining means being arranged to count clock pulses in one direction between the timing signals generated during the application of said other signal to the filter and in the other direction between the timing signals generated during the application of the third signal to the filter.

12. Apparatus as claimed in claim 1, for use when it is desired to measure the phase difference between said other signal and a third signal which may also be contaminated by harmonics, the apparatus further including a second transversal filter, identical to the first-mentioned transversal filter, for receiving and filtering the third signal, the respective means for producing the first and second timing signals being respectively connected to receive the respective filtered versions of said other signal and the third signal instead of the reference signal and the filtered version of said other signal.

13. A circuit for generating an output signal in predetermined phase relationship with an input signal of variable frequency, the circuit comprising a variable frequency oscillator arranged to produce clock pulses, an M-stage charge-coupled device for receiving and sampling the input signal and connected to be clocked by the clock pulses, whereby to produce at its output a phase-shifted version of the input signal, and a phase-sensitive detector having a first input for receiving the input signal and a second input connected to receive said phase-shifted version of the input signal, the phase sensitive detector being arranged to produce a control signal dependent on the amount by which the phase shift between the respective signals at its inputs differs from a predetermined value, and the control signal being applied to the variable frequency oscillator so as to reduce said amount.

14. A circuit as claimed in claim 13, wherein the predetermined value of the phase shift is 90°.

15. A circuit as claimed in claim 14, wherein M is equal to 90, whereby the frequency of the clock pulses is maintained equal to 360 times the frequency of the input signal.

16. A circuit as claimed in claim 15, wherein the output of the M-stage charge-coupled device is connected to the input of a P-stage charge-coupled device, which is also connected to be clocked by the clock signal.

17. A circuit as claimed in claim 16, wherein P is equal to 270 and each stage of each charge-coupled device has a respective accesible output, whereby 360 phase-shifted versions of the input signal, each phase shifted 1° with respect to the preceding one, are generated.

18. Apparatus as claimed in claim 1, wherein the circuit means is arranged to generate the clock pulses at a frequency equal to N times $f$, and the charge-coupled device is clocked directly by the clock pulses.

* * * * *

UNITED STATES PATENT OFFICE
CERTIFICATE OF CORRECTION

Patent No. 4,066,952   Dated January 3, 1978

Inventor(s) Anthony John Ley

It is certified that error appears in the above-identified patent and that said Letters Patent are hereby corrected as shown below:

IN THE SPECIFICATION:

Column 3, line 16 after "the" delete "responsive" and substitute therefor -- respective --.

Column 5, line 4 after "B sin" delete "(wt + θ)" and substitute therefor -- (wt + φ) --

Column 6, line 16, after "B sin" delete "(wt + θ)" and substitute therefor -- (wt + φ) --.

IN THE CLAIMS:

Column 9, line 8 after "respective" delete "accesible" and substitute therefor -- accessible --.

Signed and Sealed this

Second Day of May 1978

[SEAL]

Attest:

RUTH C. MASON
Attesting Officer

LUTRELLE F. PARKER
Acting Commissioner of Patents and Trademarks